United States Patent [19]

Fletcher et al.

[11] 3,996,468
[45] Dec. 7, 1976

[54] ELECTRON MICROSCOPE APERTURE SYSTEM

[76] Inventors: James C. Fletcher, Administrator of the National Aeronautics and Space Administration, with respect to an invention of Klaus Heinemann, Sunnyvale, Calif.

[22] Filed: July 23, 1973
[21] Appl. No.: 381,848

Related U.S. Application Data

[63] Continuation of Ser. No. 221,670, Jan. 28, 1972, abandoned.

[52] U.S. Cl. .............................................. 250/396
[51] Int. Cl.² ........................................ H01J 37/04
[58] Field of Search .......... 250/306, 307, 310, 311, 250/396, 398

[56] References Cited
UNITED STATES PATENTS

| | | | |
|---|---|---|---|
| 2,464,419 | 3/1949 | Smith et al. ....................... | 250/307 |
| 3,100,260 | 8/1963 | Wilska ............................... | 250/396 |
| 3,213,277 | 10/1965 | Hoppe ............................... | 250/396 |
| 3,500,043 | 3/1970 | Hanssen ............................ | 250/311 |

*Primary Examiner*—Alfred E. Smith
*Assistant Examiner*—B. E. Anderson
*Attorney, Agent, or Firm*—Darrell G. Brekke; John R. Manning

[57] ABSTRACT

An electron microscope including an electron source, a condenser lens having either a circular aperture for focusing a solid cone of electrons onto a specimen or an annular aperture for focusing a hollow cone of electrons onto the specimen, and an objective lens having an annular objective aperture, for focusing electrons passing through the specimen onto an image plane. The invention also entails a method of making the annular objective aperture using electron imaging, electrolytic deposition and ion etching techniques.

5 Claims, 9 Drawing Figures

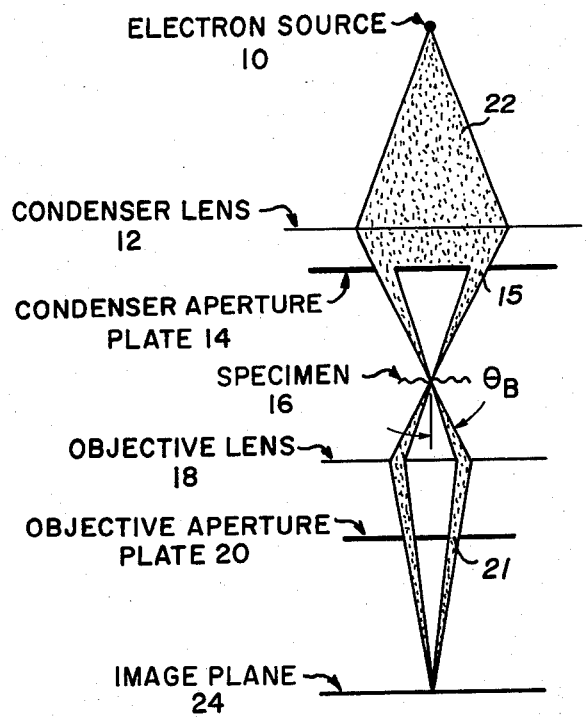
Fig_1
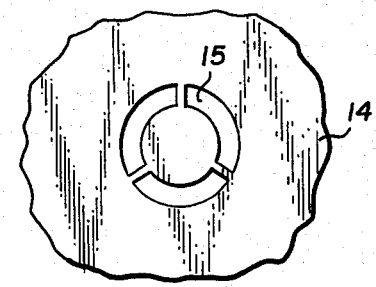
Fig_2
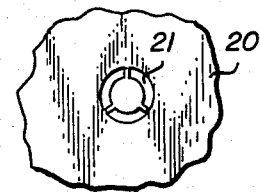
Fig_3
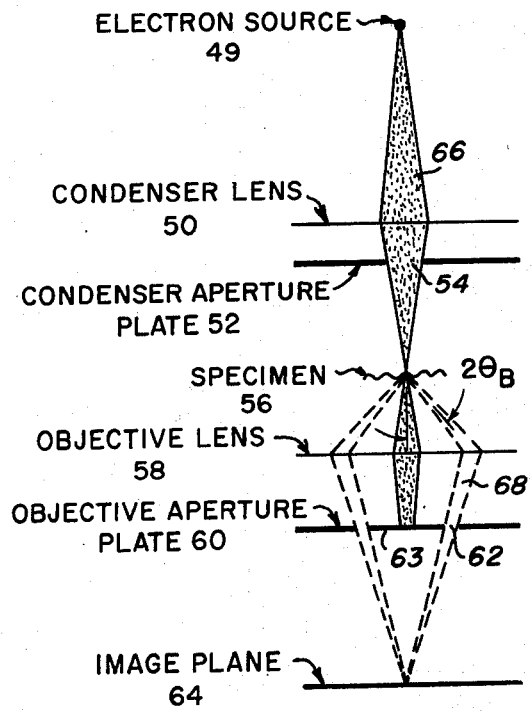
Fig_9

ELECTRON MICROSCOPE APERTURE SYSTEM

The invention described herein was made in the performance of work under a NASA contract and is subject to the provisions of Section 305 of the Natonal Aeronautics and Space Act of 1958, Public Law 850,568 (72 Stat. 435; 42 U.S.C. 2457).

This is a continuation of application Ser. No. 221,670 filed Jan. 28, 1972, now abandoned.

SUMMARY OF THE INVENTION

The present invention relates generally to corpuscular ray devices and more particularly to an electron microscope having an annular objective lens aperture for eliminating chromatic aberation and inactive spherical aberation, and a method of making the annular objective lens aperture.

Briefly, the electron microscope of the present invention includes an electron source, a condenser lens having either a circular aperture for forming a solid cone of electrons onto a specimen or an annular aperture for focusing a hollow cone of electrons onto the specimen, and an objective lens having an annular objective aperture for focusing the electrons passing through the specimen onto an image plane. The circular and annular condenser apertures can conveniently be made using conventional techniques. However, the much smaller annular objective aperture cannot conveniently be provided using prior art methods. The present invention includes a process for making the objective aperture which involves electron imaging, electrolytic deposition and ion etching techniques.

A primary advantage of the present invention is that the resolution and brightness of the high performance electron microscope can be substantially improved.

Other advantages of the present invention will no doubt become apparent to those of ordinary skill in the art after having read the following detailed description of the preferred embodiments which are illustrated in the several figures of the drawings.

IN THE DRAWINGS

FIG. 1 is a diagram schematically illustrating an electron microscope having a set of annular apertures in accordance with the present invention;

FIG. 2 is a partial plan view of an annular condenser aperture of the type used in the microscope illustrated in FIG. 1;

FIG. 3 is a partial plan view of an annular objective aperture made in accordance with the present invention;

Figure 4:
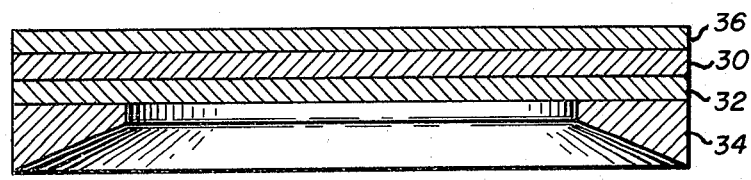

FIGS. 4–8 sequentially illustrate a method of making an annular objective aperture in accordance with the present invention;

FIG. 9 is a diagram schematically illustrating an electron microscope having a circular condenser aperture and an annular objective aperture in accordance with the present invention.

DETAILED DESCRIPTION OF THE PREFERRED EMBODIMENT

Referring now to FIG. 1 of the drawing, a schematic diagram is shown illustrating an electron microscope including an electron source 10, a condenser lens 12 having a condenser aperture plate 14 with an annular aperture 15 provided therein. Disposed on the opposite side of the specimen 16 is an objective lens 18 having an objective aperture plate 20 with an annular aperture 21 provided therein. The beam 22 of electrons developed by source 10 is focused by condenser lens 12 and passed through the annular aperture 15 to provide a hollow cone of electrons which are focused to a point on specimen 16. As the electrons pass through specimen 16 they are again focused by objective lens 18 through the annular objective aperture 21 and onto a point in image plane 24.

In using the annular condenser aperture to provide hollow cone illumination, the zero order of diffraction passes the objective lens in a respective annular zone. It can be shown mathematically that any imaging process using electrons from a particular zone of the objective lens is not subject to chromatic aberation in a mathematical approximation which is far better than required for experimental realization, and that all image information can be given in only one particular optimal defocus setting.

It can be shown that any space frequency (reciprocal specimen distances) below a maximum determined by the size of the annular condenser aperture can be transferred with almost ideally even contrast if conical specimen illumination is used in such a system with an annular objective aperture and the illumination and objective aperture cone angles are identical.

In the preferred embodiment, the size of the condenser aperture 15 is usually on the order of 2–3 millimeters in diameter with the width of the open ring area being about 100 microns. As illustrated in FIG. 2 of the drawing, the inner part of the aperture is supported by three bars dividing the open ring into three areas. Such apertures can be manufactured using conventional techniques, mechanical or otherwise. The corresponding annular objective aperture 21 (FIG. 3) however, is usually about 50 times smaller in diameter than the condenser aperture 15 (e.g., approximately 50 $\mu$m in diameter and 3 $\mu$m in ring width) and is much more difficult to manufacture. A preferred method of manufacturing an aperture plate having a suitable objective aperture is illustrated in stepwise fashion in FIGS. 4–8 and includes the following steps:

1. First, a collodium film 30 of about 500 angstroms (A) thickness is stretched over a copper specimen grid 32 which is supported on a conventional aperture base 34.

2. A metallic layer or film 36 of several hundred A thickness is then evaporated onto the upper surface of the collodium film 30 as shown in FIG. 4. The metallic film 36 must be continuous in order to be electrically conductive. If silver is chosen for film 36, a thickness of approximately 300 A is adequate.

Figure 5:
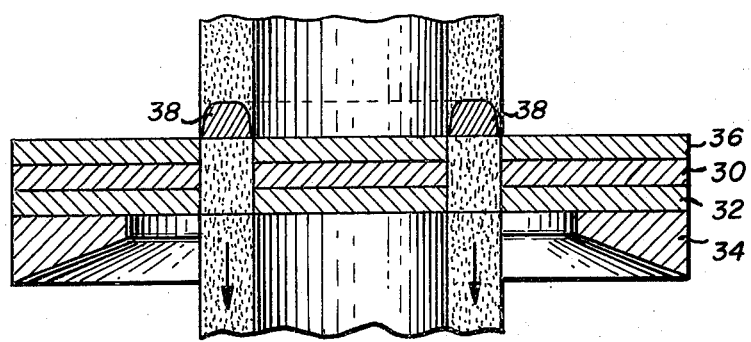

3. The prepared composite structure including film 36, film 30, and grid 32 is thereafter inserted into the regular objective aperture slider of an electron microscope, such as that illustrated in FIG. 1, having an annular condenser aperture. With the microscope operated in the selected area diffraction mode, the back focal plane of the objective lens, where the first image of the annular condenser aperture occurs and where the objective aperture diaphram is to be located, is imaged onto the image plane 24 (the microscope screen). With the image of the condenser aperture 15 falling upon the metal film 36, as illustrated in FIG. 5, a contamination layer 38, caused by the decomposition of residual gas molecules, forms on top of the metal film 36 in the illuminated area. A sufficient exposure of the electron beam is approximately 1 amp sec/cm$^2$ with the microscope operating at 100 kV. Contamination layer 38 provides a permanent image of the condenser aperture 15 and has annular dimensions corresponding to those required for the future annular objective aperture 21. In other words, the area occupied by the contamination layer 38 will be open in the final aperture plate. Note that during this step, the electron image can still be observed on the image plane 24 because the films 30 and 36 are still electron transparent.

Figure 6:
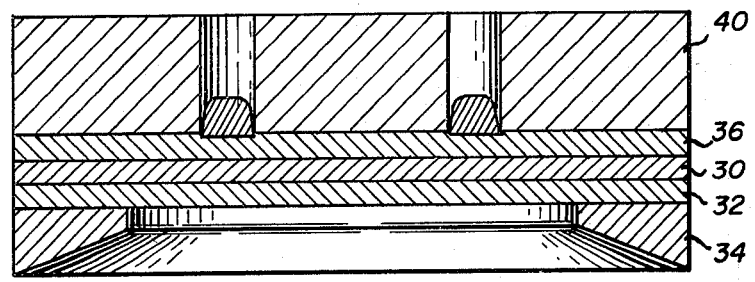
Figure 7:
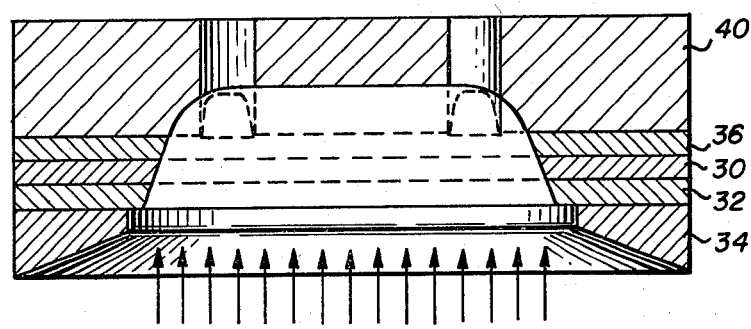
Figure 8:
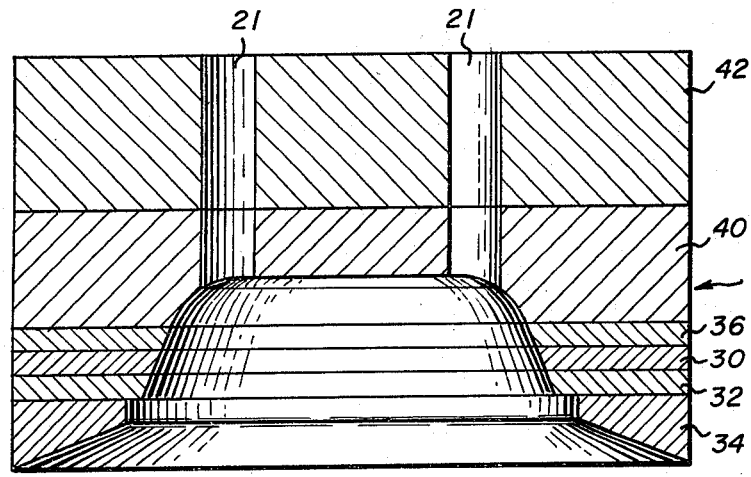

4. The composite structure is then taken out of the microscope and submerged in an electrolytic solution comprised of 250g $CuSO_4$, 1,000 ml $H_2O$, and 15 ml $H_2SO_4$, and a thin layer of metallic film 40 is galvanically grown over the exposed surfaces of film 36 as shown in FIG. 6. The metal layer 40 in the preferred embodiment is of copper and has a thickness of approximately 10,000 A.

5. The composite structure is next inserted into an ion etching device and is bombarded from beneath, i.e., the side opposite metal layer 40, with ions from a gas discharge. The, preferably Argon, ions will first etch away the collodium film 30, then the first metal film 36, and finally part of the second metal film 40 together with the contamination layer 38. During this etching process, the aperture is observed with a light microscope to determine when an etching depth sufficient to remove the contamination layer 38 has been reached. As the contamination layer 38 has been etched away, the etching process is interrupted.

6. Finally, a third metal layer 42 may be evaporated onto the surface of the composite structure for stabilization and cleanliness purposes. In the preferred embodiment a layer of gold metal of approximately 1,000 A thickness is provided. At this point the aperture plate 20 is complete and may be inserted into the electron microscope for use.

Since the characteristics of objective aperture plate 20 are uniquely related to a particular condenser aperture plate 14 and objective lens 18, it will be appreciated that the aperture 21 must necessarily correspond identically to the aperture 15. Moreover, it will be noted that since the primary determinant of dimensions of the annular aperture 21 is the electron beam cross-section, the size of the objective aperture can be increased or diminished by simply varying the focusing characteristics (focal length) of either condenser lens 12 or objective lens 18. Since the manufacturing process of the present invention involves operative steps which are inherently highly accurate in the dimensional sense, the resultant aperture is highly accurate. The production of apertures is also highly reproducible.

Using the method of the present invention, it is easily possible to print several contamination images on one aperture film so that a multi-aperture diaphram can be manufactured featuring one or more annular apertures in each grid opening. Furthermore, by varying the objective lens current, images of various sizes can be imprinted from the same original condenser aperture pattern.

The resolution limit of very high resolution electron microscopes operating in phase contrast, which is the common mode of image formation in high resolution operation and medium excelerating voltage (up to 150kV) microscopes, is determined by chromatic aberations in the objective lens. This limitation in resolution can be eliminated if only those electrons are permitted to take part in the image formation which have passed the objective lens in the same zone, that is, those electrons having the same distance from the optical axis. Such conditions can be achieved by the use of the annular objective aperture.

Annular objective apertures of the type can be used in the electron microscope in two basically different modes of operation which are dependent on the kind of specimen illumination. The two modes of illumination are (1) axial illumination and (2) complimentary hollow conical illumination. Both methods can be used to obtain ultra-high resolution with strongly reduced chromatic aberation, since the resolution is basically effected only by the imaging parts of the optical system which is unchanged and characterized by the annular objective aperture in both cases. The difference between the two modes of operation is in (a) image contrast and (b) width of the transferable space frequency band.

In accordance with the present invention, two possible combinations of these modes are permitted, i.e., (1) hollow cone illumination — annular objective aperture, and (2) axial illumination — annular objective aperture which are illustrated in FIGS. 1 and 9 respectively.

If only the annular objective aperture is used, under paraxial illumination conditions, selected dark zone field microscopy (SZDF) can be performed having (a) extremely high contrast because images appear on a black (low noise) background, (b) high resolution because the influence of chromatic aberation is eliminated, (c) images of a selected range of reciprocal space frequencies only, and thus the possibility of performing quantitatively an orientation determination of crystal and specimens, and (d) defocus dependent Bragg reflection image displacement phenomena, useful for quantitative azimuthal orientation determination of small individual crystallites.

The advantages of using an annular objective aperture in conjunction with a normal circular condenser aperture as is done in selected zone dark field microscopy are illustrated in the article "Selected Zone Dark Field Electron Microscopy", by Klaus Heinemann and Helmut Poppa, *Applied Physics Letters*, pp. Feb. 1, 1972.

In the first mode illustrated in FIG. 1, i.e., hollow conical illumination-annular objective aperture, hollow cone illumination is applied in an electron microscope using an annular condenser aperture as shown in FIG. 1. In this case, the zero order of diffraction passes the objective lens in an annular zone. Characteristic of this method is that the annular zone within which the zero order of diffraction passes the objective lens is identical with the zone selected by the annular objective aperture 21. Thus, in this mode two complimentary annular aperture diaphrams are used simultaneously, one in the illumination system and one in the imaging system.

It can be shown that any space frequency below a maximum determined by the size of the annular condenser aperture 15 (reciprocal specimen differences) can be transferred with almost ideally even contrast if conical specimen illumination is used with the annular objective aperture. Since this is a bright field mode however, there is no gain in contrast when compared to conventional bright field modes of operation. There is, on the other hand, a considerable increase in beam intensity resulting from the fact that the open area of the annular condenser aperture 15 is much larger (approximately two order of magnitude) than the open area of a conventional comparable disc aperture. Since, accordingly, the microscope can now be operated with a very low beam current, anomalous beam energy broadening effects (Boersch-Effect) can be avoided. This adds to the earlier mentioned significant decrease in effective chromatic aberation.

The second mode (axial illumination-annular objective aperture) is illustrated in FIG. 9. The apparatus for implementing this mode includes an electron source 49, a condenser lens 50 and a condenser aperture plate 52 having a circular aperture 54. Disposed on the other side of the specimen 56 are the objective lens 58, an objective aperture plate 60 having an annular aperture 62 and the image plane 64.

In this mode the zero order of diffraction is blocked off (the criterion for dark-field microscopy) by the center portion 63 of aperture plate 60, and the annular objective aperture 62 selects a special objective lens zone only for the image formation. This method has been called selected-zone-dark-field-microscopy. Contrary to the usual modes of microscopy, this is a typical phase contrast dark field method. The image is an interference image between two beams which have been diffracted at the specimen and passed through the objective lens into azimuthally different locations in the same zone (with the same aperture angle $\theta_B$). Consequently, a small aperture width restricts the width of the space frequency band which is transferrable considerably. This may be undesirable in the case where amorphous specimens are being observed, where practically all distances between specimen details occur and should be resolved. If, however, crystalline specimens are observed, only discrete object distances, the interplanar distances of the ordered atom planes, are necessary and available to be imaged if the diameter of the annular objective aperture is selected properly. Such images occur with remarkable high contrast, as can be expected in dark field microscopy.

It is possible that interference between two non-symmetrically diffracted beams, i.e., two beams which have been Bragg diffracted at two different overlapping sets of lattice planes with the same separation but different azimuthal orientation, can occur. These interferences will, for example, in a [110] oriented f.c.c. crystal result in simultaneous "pseudo" images of [200] and [220] lattice planes together with the ordinary [111] lattice planes, if the annular objective aperture was designed for [111] Bragg diffraction at crystalline material of such or similar cell dimensions.

The use of an annular objective aperture in the case of axial illumination is not only valuable for high resolution images of crystal or graphic lattice planes but can be advantageously applied if the crystal or graphic orientation of small crystallite has to be determined. This can be done without direct images of the lattice planes of the cells.

Although it is further contemplated that additional modifications of the above disclosed invention will no doubt become apparent to those of ordinary skill in the art after having read the above description of the preferred embodiment, it is to be understood that this description is made for purposes of illustration only and is in no way intended to be limiting. Accordingly it is intended that the appended claims be interpreted as including all modifications which fall within the true spirit and scope of the invention.

What is claimed is:

1. In an improved electron optical system of the type having an electron source for generating an electron stream, condenser means for focusing said electron stream onto a specimen, a condenser aperture for guiding the electron stream onto the specimen, and an objective lens for focusing said electron stream onto an image plane, wherein the improvement comprises an objective aperture plate having an annular aperture as the only opening therein for limiting the number of electrons which can intersect the said image plane to only that fraction which has passed the said objective lens in the same lens zone.

2. The optical system of claim 1 wherein the objective aperture plate is located in the back focal plane of the said objective lens.

3. The optical system of claim 1 adapted for dark field operation wherein the condenser means includes a condenser lens having a circular aperture.

4. The optical system of claim 1 adapted for bright field operation wherein the condenser means includes a condenser lens having an annular aperture.

5. An electron optical system, comprising:
an electron source for developing an electron stream;
a condenser lens for focusing said electron stream onto a specimen;
a condenser aperture for guiding the electron stream onto the said specimen;
an objective lens for focusing said electron stream onto an image plane;
an annular objective aperture plate having an annular aperture as the only opening therein for limiting the number of electrons which can intersect said image plane to only that fraction which has passed the said objective lens in the same lens zone.

* * * * *